United States Patent
Yip et al.

(10) Patent No.: US 8,410,604 B2
(45) Date of Patent: Apr. 2, 2013

(54) LEAD-FREE STRUCTURES IN A SEMICONDUCTOR DEVICE

(75) Inventors: Laurene Yip, San Francisco, CA (US); Leilei Zhang, Sunnyvale, CA (US); Kumar Nagarajan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 245 days.

(21) Appl. No.: 12/912,519

(22) Filed: Oct. 26, 2010

(65) Prior Publication Data

US 2012/0098130 A1  Apr. 26, 2012

(51) Int. Cl.
- H01L 23/48 (2006.01)
- H01L 23/52 (2006.01)
- H01L 29/40 (2006.01)
- H01L 21/44 (2006.01)
- H01L 21/00 (2006.01)

(52) U.S. Cl. ........... 257/738; 257/E23.069; 257/739; 257/778; 438/108; 438/613

(58) Field of Classification Search ............... 257/738, 257/739, E23.069, 778; 438/108, 613
See application file for complete search history.

(56) References Cited

U.S. PATENT DOCUMENTS

| | | | |
|---|---|---|---|
| 5,431,328 | A | 7/1995 | Chang et al. |
| 5,790,377 | A | 8/1998 | Schreiber et al. |
| 6,638,847 | B1 | 10/2003 | Cheung et al. |
| 7,388,284 | B1 | 6/2008 | Zhang |
| 7,545,028 | B2 | 6/2009 | Zhang |
| 2003/0034565 | A1* | 2/2003 | Lan et al. ............... 257/778 |
| 2003/0082846 | A1 | 5/2003 | Yoneda et al. |
| 2005/0029110 | A1* | 2/2005 | Tang et al. ............... 205/125 |
| 2005/0167830 | A1* | 8/2005 | Chang et al. ............ 257/737 |
| 2009/0108442 | A1* | 4/2009 | Fitzsimmons et al. ... 257/737 |
| 2009/0111277 | A1* | 4/2009 | Verhaverbeke .......... 438/754 |
| 2009/0121334 | A1* | 5/2009 | Oi et al. ................. 257/678 |
| 2009/0146316 | A1 | 6/2009 | Jadhav et al. |
| 2009/0184420 | A1 | 7/2009 | Choi et al. |
| 2009/0218672 | A1* | 9/2009 | Nakamura et al. ...... 257/690 |
| 2009/0229861 | A1 | 9/2009 | Hando et al. |

OTHER PUBLICATIONS

Huffman, Alan et al., "Effects of Assembly Process Parameters on the Structure and Thermal Stability of Sn-Capped Cu Bump Bonds," *Proc. of the 2007 Electronic Components and Technology Conference*, May 29, 2007, pp. 1589-1596, IEEE, Piscataway, New Jersey, USA.

(Continued)

*Primary Examiner* — Michael Lebentritt
*Assistant Examiner* — Aaron Dehne
(74) *Attorney, Agent, or Firm* — LeRoy D. Maunu

(57) ABSTRACT

A semiconductor device includes a semiconductor die and a plurality of lead-free solder bumps disposed on a surface of the semiconductor die. A substrate includes a plurality of metal layers and a plurality of dielectric layers. One of the metal layers includes a plurality of contact pads corresponding to the plurality of lead-free solder bumps, and one of the dielectric layers is an exterior dielectric layer having a plurality of respective openings for the contact pad. A plurality of respective copper posts is disposed on the contact pads. The respective copper post for each contact pad extends from the contact pad through the respective opening for the contact pad. The semiconductor die is mounted on the substrate with connections between the plurality of lead-free solder bumps and the plurality of copper posts.

18 Claims, 9 Drawing Sheets

OTHER PUBLICATIONS

IBM, *Ceramic Column Grid Array Assembly and Rework User's Guide*, Jul. 25, 2002, pp. 1-10, IBM Microelectronics Division, Hopewell Junction, New York, USA.

Lee, M., et al., "Study of Interconnection Process for Fine Pitch Flip Chip", ECTC 2009 59th, 2009 Electronic Components and Technology Conference, May 26-29, 2009, pp. 720-723.

Gupta, et al., "Cu Pillars on Substrates- a Low Cost Alternative for the Next Generation of Flip Chip Packaging Technology", ECTC 2010 60th, 2010 Electronic Components and Technology Conference, Jun. 1-4, 2010, pp. 1422-1428.

* cited by examiner

LEAD-FREE STRUCTURES IN A SEMICONDUCTOR DEVICE

FIELD OF THE INVENTION

One or more embodiments relate generally to semiconductor devices, and more particularly, to a lead-free solder assembly for a semiconductor device and a method of fabricating the same.

BACKGROUND

An increasing demand for electronic equipment that is smaller, lighter, and more compact has resulted in a concomitant demand for semiconductor packages that have smaller outlines and mounting areas or "footprints." One response to this demand has been the development of the ball grid array (BGA) semiconductor package, which "surface mounts" and electronically connects to a printed circuit board (PCB) with a plurality of solder balls. Another response has been the development of the "flip-chip" method of attachment and connection of semiconductor chips or "dice" to substrates (e.g., PCBs or lead-frames). Flip-chip mounting involves the formation of bumped contacts (e.g., solder balls) on the active surface of the die, then inverting or "flipping" the die upside down and reflowing the bumped contacts (i.e., heating the bumped contacts to the melting point) to fuse them to the corresponding pads on the substrate.

In both the BGA package and flip-chip mounting and connection methods, thermo-mechanical reliability is becoming an increasing concern of the electronic industry. Notably, the reliability of the solder joints is one of the most critical issues for successful application of such mounting and connection methods.

Within a flip-chip package, the integrated circuit die has solder bumps fused to corresponding pads on the substrate. These solder joints may be prone to cracks at high-stress points due to thermal stress cycling.

The Restriction of Hazardous Substances (RoHS) Directive limits the concentration of lead in components of electronic equipment. To comply with RoHS requirements, tin-lead solders are replaced with lead-free solders, such as tin-silver solders, that meet the RoHS requirement of a lead concentration of less than 0.1% by weight. However, this replacement adversely affects the thermo-mechanical reliability of solder joints because lead-free solders are generally more brittle than tin-lead solders.

One or more embodiments of the present invention may address one or more of the above issues.

SUMMARY

In one embodiment, a semiconductor device is provided. The semiconductor device includes a semiconductor die and a plurality of lead-free solder bumps disposed on a surface of the semiconductor die. A substrate includes a plurality of metal layers and a plurality of dielectric layers. One of the plurality of metal layers includes a plurality of contact pads corresponding to the plurality of lead-free solder bumps, and one of the plurality of dielectric layers is an exterior dielectric layer having a plurality of respective openings for the plurality of contact pads. A plurality of respective copper posts is disposed on the plurality of contact pads. The respective copper post for each contact pad extends from the contact pad through the respective opening for the contact pad. The semiconductor die is mounted on the substrate with connections between the plurality of lead-free solder bumps and the plurality of copper posts.

In another embodiment, a method of fabricating a semiconductor device includes forming a semiconductor die having a plurality of lead-free solder bumps for connecting to a substrate. An interposer substrate is formed and includes an exterior dielectric layer and a plurality of contact pads. The plurality of contact pads are exposed through a plurality of respective openings in the exterior dielectric layer. A plurality of respective copper posts is formed on the plurality of contact pads. The respective copper post for each contact pad extends from the contact pad through the respective opening for the contact pad. The plurality of lead-free solder bumps of the semiconductor die and the plurality of respective copper posts on the plurality of contact pads of the interposer substrate are aligned, and the plurality of lead-free solder bumps are reflow soldered to the plurality of respective copper posts.

Another method of fabricating a semiconductor device includes forming a semiconductor die having a plurality of lead-free solder bumps for connecting to a substrate. An interposer substrate is formed and includes an exterior dielectric layer and a plurality of contact pads. The plurality of contact pads are exposed through a plurality of respective openings in the exterior dielectric layer. The plurality of contact pads are covered through the plurality of respective openings with a plurality of respective pre-solder pads. The plurality of lead-free solder bumps of the semiconductor die are aligned with the plurality of respective pre-solder pads on the interposer substrate. The plurality of lead-free solder bumps and the plurality of pre-solder pads are reflow soldered onto the plurality of contact pads.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Figure 1:
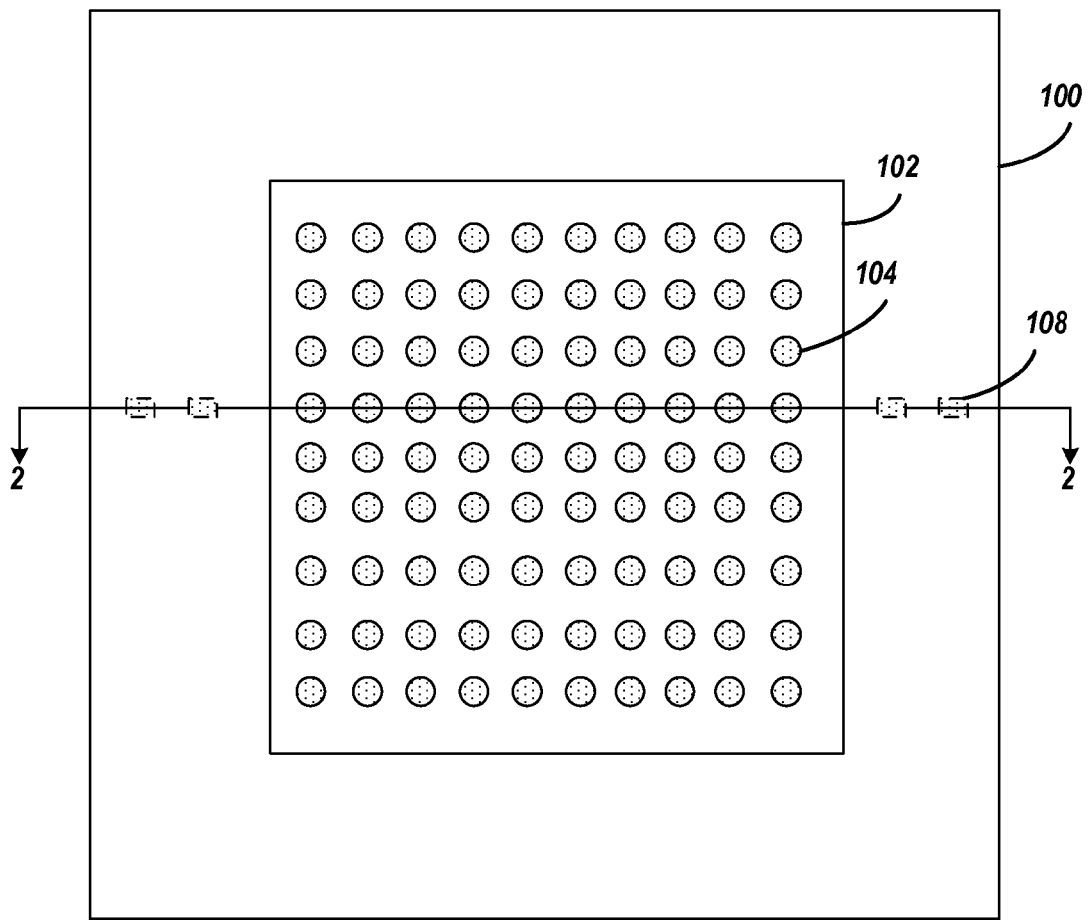
FIG. 1 is a top plan view of an integrated circuit substrate for a flip chip package.

FIG. 1 is a top plan view of an integrated circuit substrate 100 for a semiconductor device such as, e.g., a flip chip package. Flip chip packages are thermally enhanced ball grid arrays (BGAs) with the active surface of the semiconductor die facing the substrate 100. Because of their layout, flip chip packages lend themselves to the application of external heat sinks coupled to the back of the semiconductor die. The heat sinks are either passive or active to improve heat removal efficiency. The integrated circuit substrate 100 includes a region 102 having contact pads 104 with copper posts and/or a coating of copper and tin for attaching the flip chip die, and contact pads 108 for attaching other components, such as chip capacitors.

Figure 2:
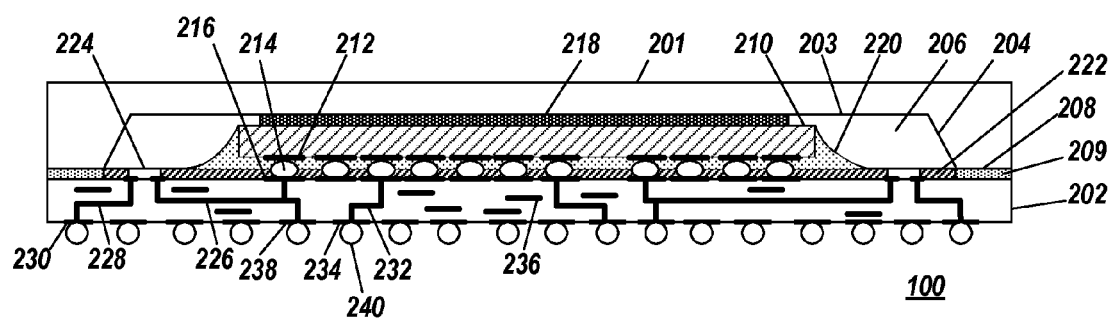
FIG. 2 is a cross-sectional view of the substrate of FIG. 1 taken at lines 2-2 and including an integrated circuit die and a lid that together form a flip chip package.

FIG. 2 is a cross-sectional view of the substrate of FIG. 1 taken at lines 2-2 and including an integrated circuit die 210 and a lid 201 that together form a flip chip package. The lid 201 is coupled to a substrate 202 and comprises an inner surface 203 and inner wall 204 forming a recess 206. The lid further comprises a foot portion 208 coupled to the substrate 202 by a bonding agent 209, such as an adhesive. An integrated circuit die 210 has silicon metal contact pads 212 and corresponding solder bumps 214, which make contact with contact pads 216 of the substrate. In one or more embodiments, the contact pads 216 have associated copper posts and/or a coating for bonding with solder bumps 214. An exterior dielectric layer 222 of the substrate 202 has openings for the contact pads 216. An adhesive 218 may be used above the integrated circuit die 210, and an underfill 220 may be used below the integrated circuit die. As is also shown, the substrate 202 is a multilayer substrate having conductors formed on a plurality of metal layers separated by dielectric layers. A capacitor 224 on the surface of the substrate is coupled to the integrated circuit die by a conductor 226 on a metal layer of the substrate and a corresponding power contact 238 on the bottom portion of the substrate. The capacitor is also coupled to a ground plane 228 and a corresponding contact pad 230. Other conductors 232 may extend directly from contact pads on the top of the substrate to contact pads 234 on the bottom of the substrate. Conductors 236 in various layers of the multilayer substrate are also shown. The substrate artwork defines the various conductors so that the proper connections are made from the contact pads of the integrated circuit die (by way of the solder bumps and contact pads on the top of the substrate) to the contacts on the bottom of the substrate. The bottom of the substrate has solder balls 240 arranged in a grid array, and the contact pads 234 have associated copper posts and/or a coating for bonding with solder balls 240 in one embodiment.

Figure 3:
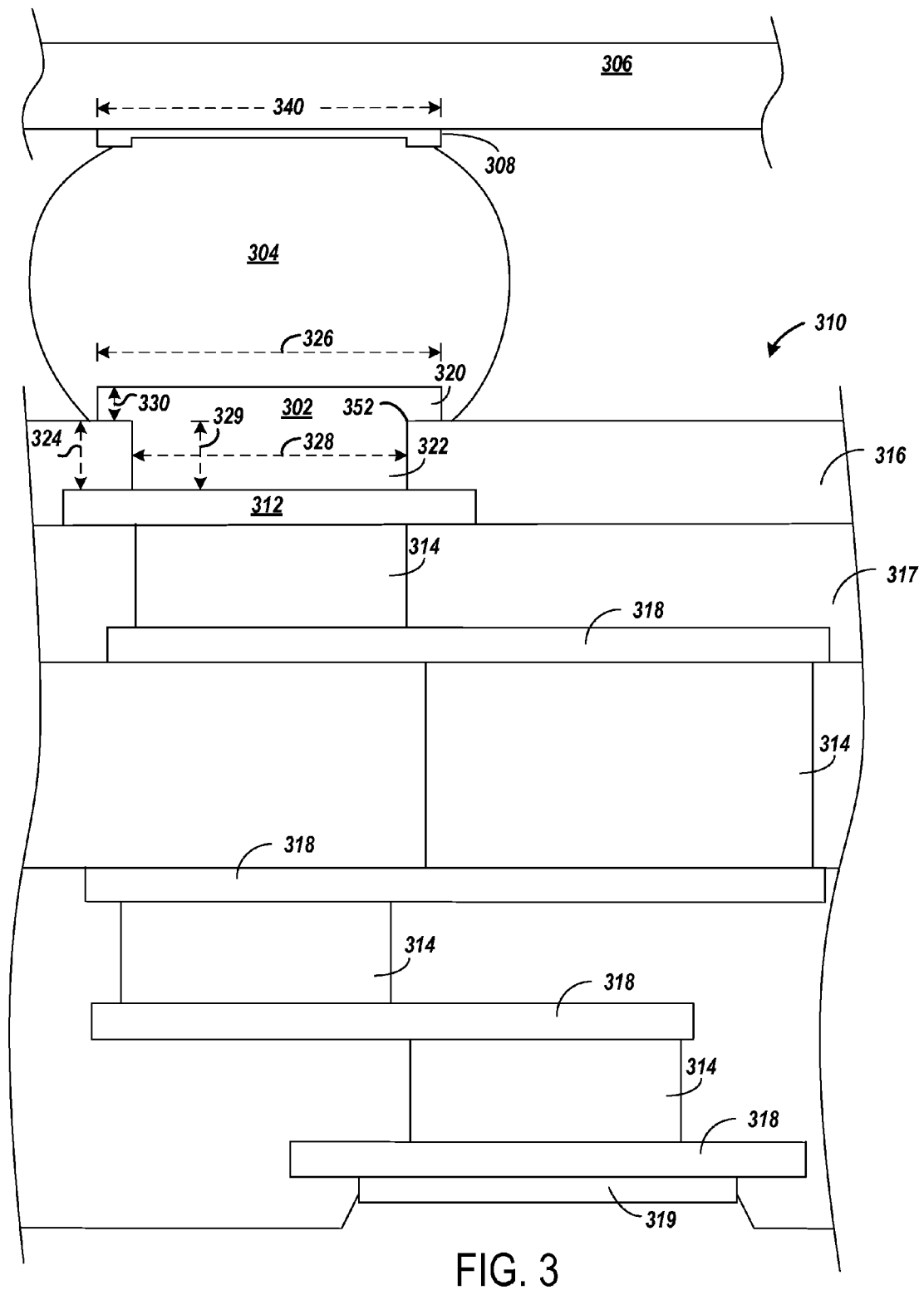
FIG. 3 is a cross-sectional view of a portion of a flip chip package.

FIG. 3 is a cross-sectional view of a portion of a flip chip package. The structure of the flip chip package includes a solder joint with a post 302 that eliminates the stress concentration point at the edge 352 of the dielectric opening on the substrate pad side, thereby increasing the reliability of the flip chip package.

In one or more embodiments, a surface of the semiconductor die 306 includes a silicon metal pad 308 and the solder bump 304 is initially disposed on the silicon metal pad 308. The multilayer substrate 310 includes a contact pad 312 in a metal layer of the substrate. The contact pad 312 is connected to a solder ball (e.g., FIG. 2, 240) of the flip chip package or another component within the flip chip package through metal vias 314, metal layers 318, and pad 319. In an alternate embodiment, the metal vias 314 shown in FIG. 3 can be tapered so as to have slanted side walls. In other embodiments, the metal vias 314 can have other well known shapes. The multilayer substrate 310 has an exterior dielectric layer 316 with an opening for the contact pad 312 that the post 302 fills.

In one embodiment, the solder bump 304 is composed of lead-free alloy such as tin, tin-silver, tin-silver-copper, tin-copper, or gold. Such lead-free alloys provide RoHS compliance, but are so brittle that without post 302, solder bump 304 would fracture during repeated thermal cycling of the flip chip package. Such thermal cycling may be caused by heating of integrated circuit 306 during powered operation and cooling to an ambient temperature after power is removed. Such fracturing is especially problematic when the ratio of the size of the die 306 to the size of the substrate 310 is large. A large die/substrate ratio will cause higher stress in the package. The post 302 is composed of copper, which is more flexible than the lead-free solder bump 304. Thus, the solder bump structure with the integrated post can withstand higher thermo-mechanical stresses, preventing fracture of the lead-free solder bump 304 and increasing the reliability of the flip chip package.

The exterior dielectric layer 316 is Ajinomoto Build-up Film (ABF), which is available from Ajinomoto, Inc., in one embodiment. This epoxy composite is softer than some solder mask materials used on the surface of the substrate. This flexibility allows post 302 to flex under thermo-mechanical stresses even when post 302 completely fills the opening in the dielectric layer. The exterior dielectric layer 316 is more flexible than others of the plurality of dielectric layers, for example dielectric layer 317. The exterior dielectric layer 316 adheres to the contact pad 312 completely around the periphery of the contact pad 312.

In one embodiment, the post 302 has an end cap 320 and an inner portion 322. The end cap 320 of post 302 is distal from the contact pad 312, and the inner portion 322 of post 302 is between the contact pad 312 and the end cap 320. The end cap 320 has a width 326 that exceeds the width 328 of the inner portion 322. The larger end cap of the post will increase the contact area for the bump and reduce the overall stress level of the bump. In one embodiment, the opening in the exterior dielectric layer 316 is cylindrical and has a height 324 equaling a thickness of the exterior dielectric layer 316 over the contact pad 312. The opening also has a diameter inside a periphery of the contact pad 312, and this diameter equals the width 328 of a cylindrical post 302 when the post fills the opening. The post 302 extends from the contact pad 312 through the opening and beyond its height and diameter. This is achieved in one embodiment by plating copper onto the copper contact pad 312 until the plated copper fills and overflows the opening in the dielectric layer 316.

The flip chip package is made by reflow soldering the solder bump 304 onto the silicon metal pad 308 and the post 302. This melts the solder bump 304 to form a mechanical and electrical connection between the semiconductor die 306 and the substrate 310. In one embodiment, the reflow soldering results in the area of contact between the solder bump 304 and the silicon metal pad 308 being approximately equal to the area of contact between the solder bump 304 and the end cap 320 of post 302. Where the areas of contact are approximately equal, the stress is balanced between the contact areas. A large difference between the sizes of the areas of contact will create an imbalance in the stresses occurring between the areas of contact, leading to an increase in the susceptibility to failure. Thus, the contact areas need not be exactly equal in size. But more balance in stress will result when the contact areas are closer in size.

In one embodiment, the areas of contact of the solder bump 304 with the silicon metal pad 308 and the post 302 both exceed a cross-sectional area through the inner portion 322 of the post 302. By eliminating the stress concentration point at the edge 352 of the dielectric opening and increasing the contact area of the solder joint, the fatigue life of the solder joint can be increased.

In one embodiment, the post 302 has width 328 through the inner portion 322 of 50 to 85 micrometers, a width 326 of the end cap 320 of 50 to 115 micrometers, and a height 324 of less than 30 micrometers. For a post structure 302 having a width 326 (*b*) greater than the width 328 (*a*), and a height 324 (*c*), the ratio of the height 324 to the width 328 is generally less than 1 (c/a<1). For the width 340 (*f*) of pad 308 and the width 326 (*b*) of the post 302, in one embodiment, the ratio (f/b) is approximately equal to 1. In other embodiments, the ratio may be in the range, 0.50≦f/b≦1.50. Those skilled in the art will recognize that as technology progresses, smaller bump pitches and smaller dielectric openings may be feasible.

Figure 4:
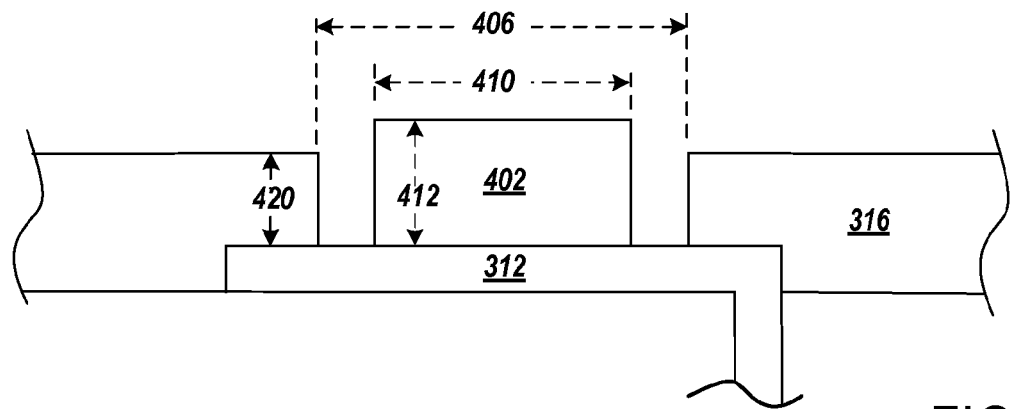
FIG. 4 is a cross-sectional view illustrating one embodiment of a post.

FIG. 4 is a cross-sectional view illustrating a post 402 in accordance with one embodiment. The post 402 extends from the contact pad 312 though an opening of width 406 in the exterior dielectric layer 316. However, the post 402 does not completely fill the opening and a gap is formed between the post 402 and the sidewalls of the opening because the width 410 of the post is less than the width 406 of the opening. Thus, post 402 does not extend beyond the width 406 of the opening in the exterior dielectric layer 316 even though post 402 extends from the contact pad 312 through the opening. In an example embodiment, the ratio of the height of the post 412 (*d*) to the height 420 (*c*) of the dielectric layer 316 above the contact pad 312 is greater than 1.1 (d/c≧1.1). In a particular example, d may be greater than c by 2 μm.

Figure 5:
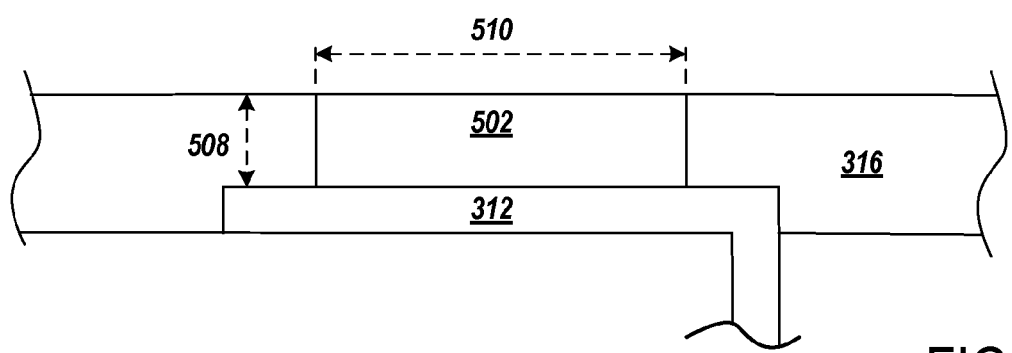
FIG. 5 is a cross-sectional view illustrating another embodiment of a post.

FIG. 5 is a cross-sectional view illustrating a post 502 in accordance with another embodiment. The post 502 completely fills an opening in the exterior dielectric layer 316. The post 502 extends from the contact pad 312 though the opening without going beyond the height 508 of the opening and without going beyond the width 510 of the opening.

In one embodiment, the post 502 has a roughened surface finish for enhancing the reflow soldering of a lead-free bumps onto the post 502.

Figure 6:
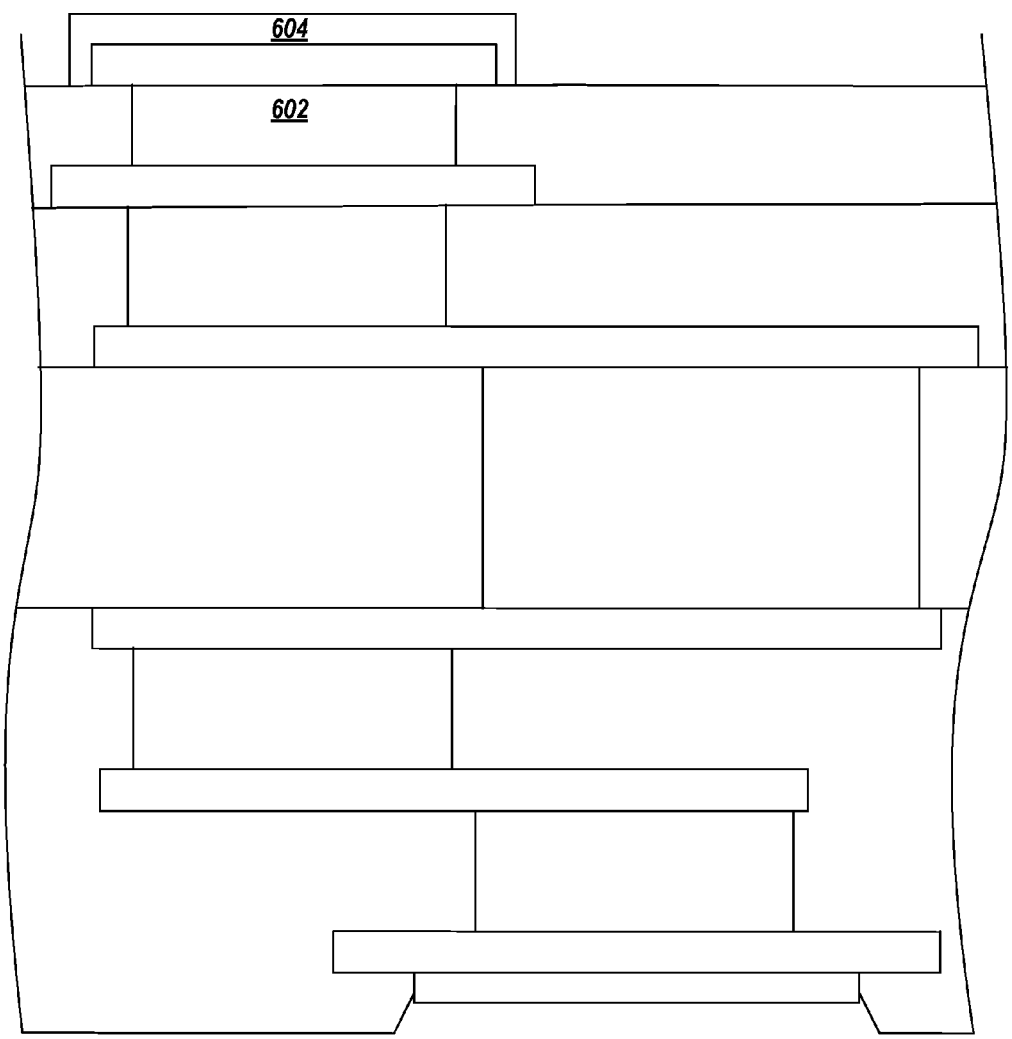
FIG. 6 is a cross-sectional view illustrating a post with a coating.

FIG. 6 is a cross-sectional view illustrating a post 602 with a coating 604. The coating 604 enhances the reflow soldering of lead-free solder bump 606 onto post 602.

In one embodiment, the pre-solder coating 604 is printed on the post 602 and is composed of tin and copper while solder bump 606 is composed of a lead-free alloy including tin and silver. During reflow soldering, solder bump 606 and coating 604 completely melt to form the solder joint. During reflow soldering, the coating 604 causes solder bump 606 to have a reduced silver content in the vicinity of the post 602. This makes the solder bump 606 more ductile and less prone to failure where it experiences the highest thermo-mechanical stresses. Thus, solder bump 606 is less likely to fracture from any thermo-mechanical stresses that are not absorbed by post 602.

Figure 7:
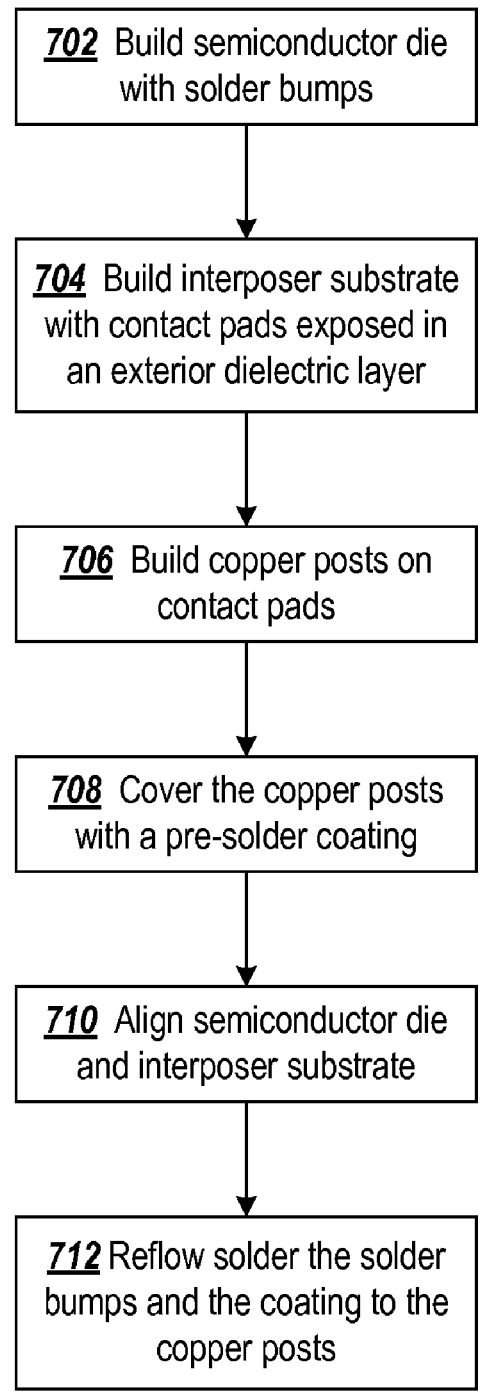
FIG. 7 is a flowchart of a process for making a flip-chip structure.

FIG. 7 is a flowchart of a process for making a flip-chip structure in accordance with one embodiment.

At step 702, a semiconductor die is built that has lead-free solder bumps for connecting to a substrate. At step 704, an interposer substrate is built that includes an exterior dielectric layer and contact pads that are exposed through openings in the exterior dielectric layer.

At step 706, copper posts are built on the contact pads. The copper post for each contact pad extends from the contact pad through the opening for the contact pad. In one embodiment, the copper post for each contact pad is built with an end cap distal from the contact pad and the post having an inner portion between the contact pad and the end cap. A width of the end cap exceeds a width of the inner portion and a height of the inner portion exceeds a height of the end cap.

An example method of forming a copper post on the substrate is to apply a dry film resist material or dielectric layer to the outer layer of the substrate. Openings are then formed to expose copper contact pads in the substrate. Copper is plated to form the post on the contact pads. The dry film resist material is then removed, and a surface treatment or pre-solder may be applied to the top of the copper post. An advantage of having the copper post structure is that the width of the post can be independent of the width of the dielectric or solder mask opening. Thus the ratio of the top width of the copper post may be better matched with the width of the silicon metal pad (FIG. 3, 308) to form a more uniform shape for the solder joint and reduce the overall bump stress.

At step 708, the copper posts are covered through the openings with a coating composed of a lead-free presolder. At step 710, the lead-free solder bumps of the semiconductor die are aligned with the copper posts on the contact pads of the interposer substrate.

At step 712, the lead-free solder bumps and the coating are reflow soldered onto the copper posts. In one embodiment, each lead-free solder bump is reflow soldered to an area of a silicon metal pad and to an equal area of the coated copper post, and these areas each exceed a cross-sectional area through a inner portion of the copper post.

Figure 8:
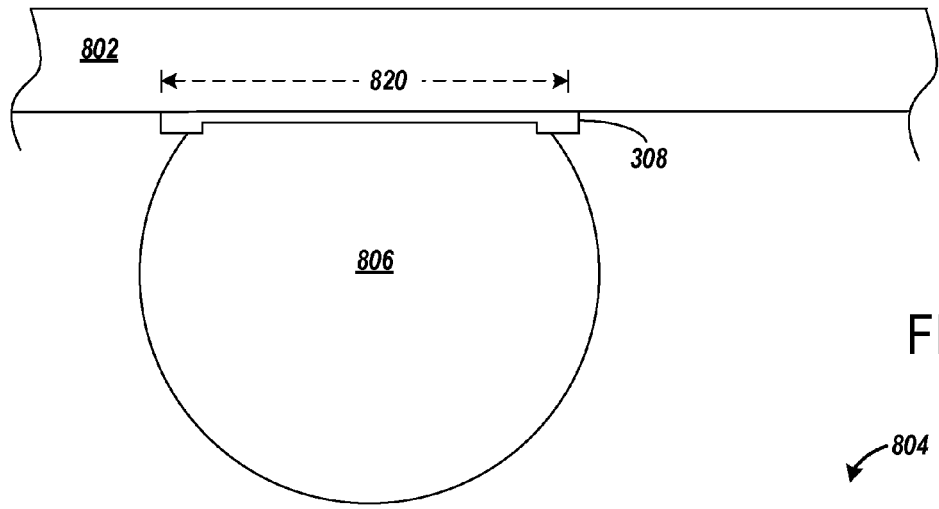
FIG. 8 is a cross-sectional view of a portion of a semiconductor die and a portion of a substrate.
Figure 8:
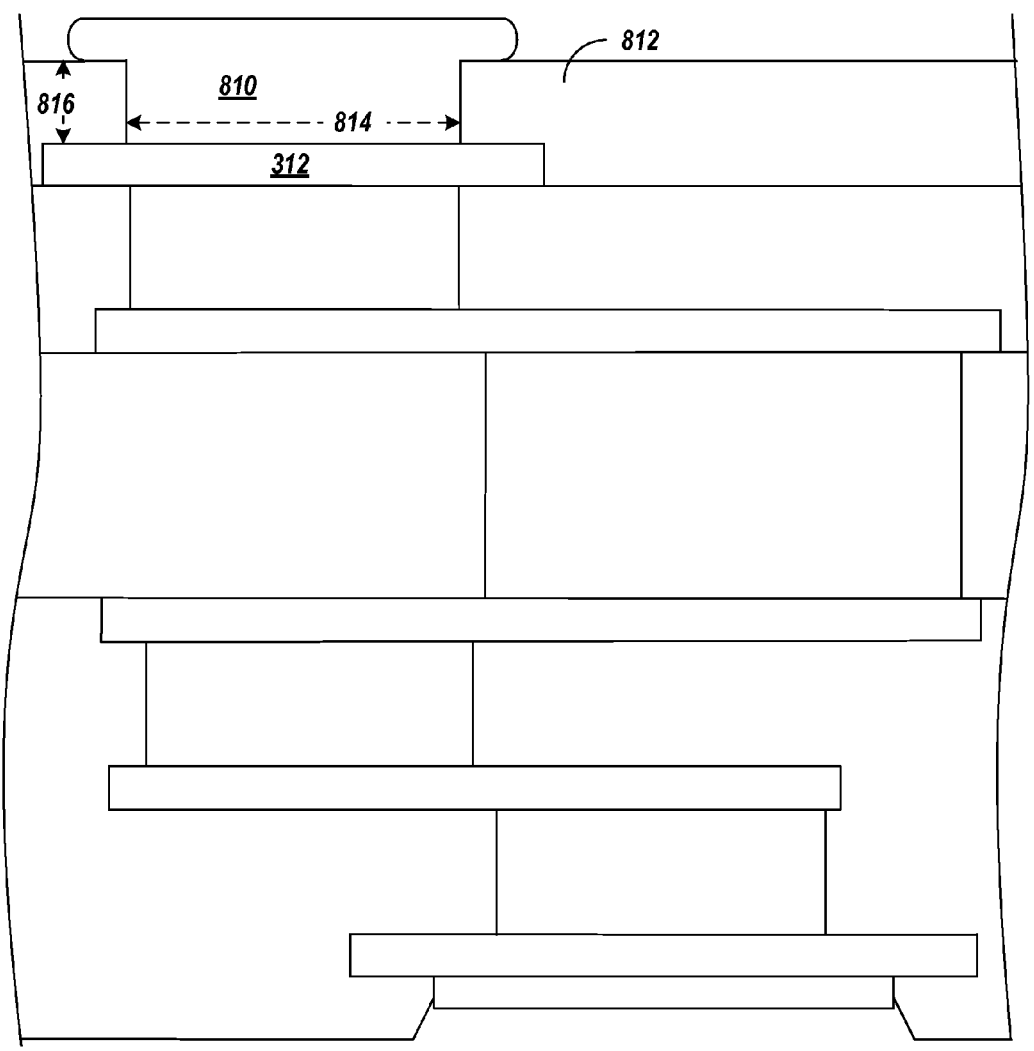

FIG. 8 is a cross-sectional view of a portion of a semiconductor die 802 and a portion of a substrate 804 in accordance with one embodiment. The lead-free solder bump 806 is composed of an alloy containing tin and silver (e.g., SnAg2.3 or SnAg1.8), the contact pad 312 is composed of copper, and the pre-solder pad 810 is composed of an alloy of tin and copper (e.g., SnCu0.7).

In one embodiment, a solder paste includes a soldering flux and a powder of the tin-copper alloy. To create the pre-solder pad 810, the solder paste may be silk-screened onto the exterior dielectric layer 812 and the contact pad 312 through an opening in the exterior dielectric layer 812. The pre-solder paste fills the opening in the exterior dielectric layer 812 and extends from the contact pad 312 through and beyond the width 814 and height 816 of the opening, thereby forming the pre-solder pad 810.

In one embodiment, the ratio of the width 814 (*f*) of the dielectric opening to the width 820 (*g*) of the silicon metal pad 308 may be approximately equal to 1 (f/g=1). In another embodiment, the width 814 of the dielectric opening may be slightly greater than the width 820 of the silicon metal pad 308 (e.g., f/g≧1.1).

Figure 9:
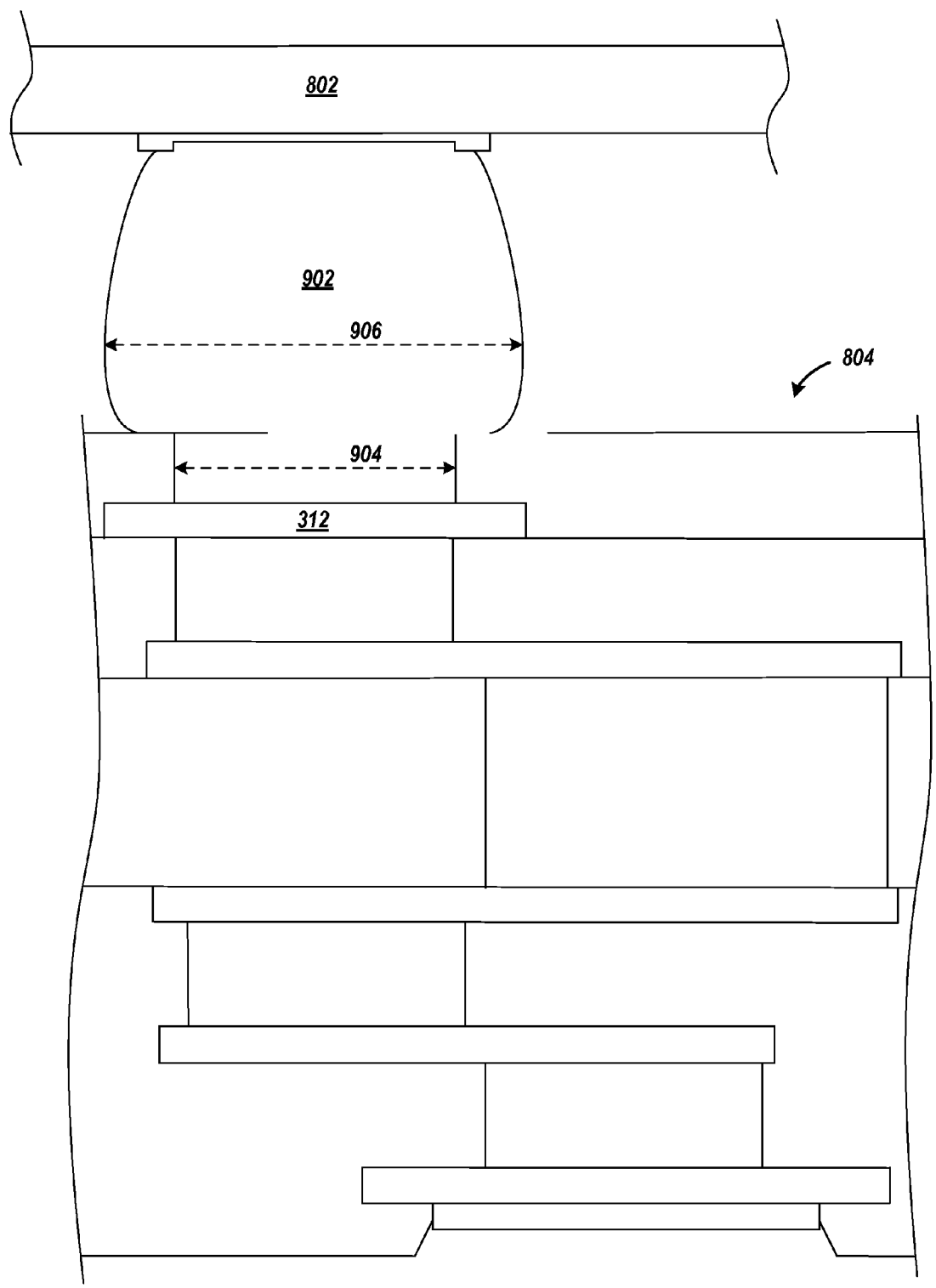
FIG. 9 shows the semiconductor die and the substrate of FIG. 8 after reflow soldering.

FIG. 9 shows the semiconductor die 802 and the substrate 804 of FIG. 8 after reflow soldering in accordance with one embodiment. The solder joint 902 is formed from the solder bump 806 and the pre-solder pad 810 of FIG. 8 during reflow soldering.

In one embodiment, the reflow melts the solder bump 806 and the solder paste of pre-solder pad 810 while expelling the solder flux. The different alloys of the solder bump 806 and the pre-solder pad 810 diffuse partially into each other during reflow soldering.

Figure 10:
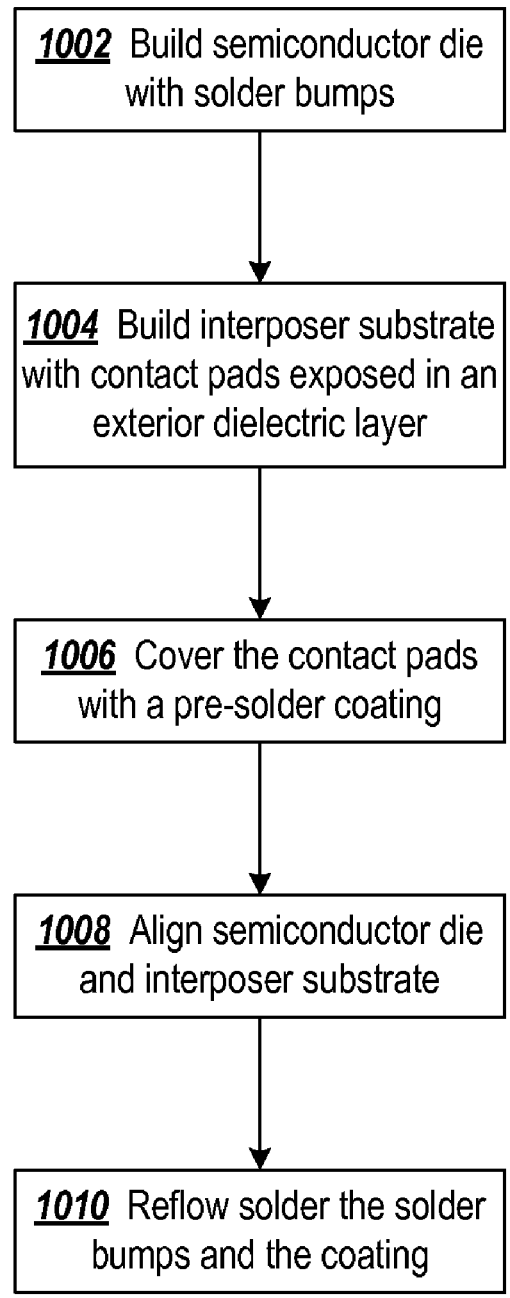
FIG. 10 is a flowchart of a process for making the structure of FIG. 9.

FIG. 10 is a flowchart of a process for making the structure of FIG. 9. At step 1002, a semiconductor die is built that has lead-free solder bumps for connecting to a substrate. At step 1004, an interposer substrate is built that includes an exterior dielectric layer and contact pads that are exposed through openings in the exterior dielectric layer. The openings may be formed by applying a solder mask to the substrate and removing unmasked dielectric material to expose contact pads. At step 1006, the contact pads are covered through the openings with a coating composed of a tin and copper eutectic. The pre-solder pad (FIG. 8, 810) may be formed by first applying a surface finish and then printing solder paste in the openings over the contact pads.

At step 1008, the lead-free solder bumps of the semiconductor die are aligned with the coated contact pads of the interposer substrate. At step 1010, the lead-free solder bumps and the coating are reflow soldered.

One or more embodiments of the present invention are thought to be applicable to a variety flip chip structures. Other aspects and embodiments will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A semiconductor device, comprising:
a semiconductor die;
a plurality of lead-free solder bumps disposed on a surface of the semiconductor die;
a substrate including a plurality of metal layers and a plurality of dielectric layers, wherein one of the plurality of metal layers includes a plurality of contact pads corresponding to the plurality of lead-free solder bumps, and one of the plurality of dielectric layers is an exterior dielectric layer having a plurality of respective openings for the plurality of contact pads;
a plurality of respective copper posts disposed on the plurality of contact pads, wherein the respective copper post for each contact pad extends from the contact pad through the respective opening for the contact pad; and
wherein:
the semiconductor die is mounted on the substrate with connections between the plurality of lead-free solder bumps and the plurality of copper posts;
the surface of the semiconductor die has a respective silicon metal pad disposed at each of the plurality of lead-free solder bumps;
each lead-free solder bump is reflow soldered to a first area of the respective silicon metal pad and to a second area of the respective copper post; and
the first and second areas are equal in size and each size exceeds a cross-sectional area through an inner portion of the respective copper post, the inner portion between the contact pad and the second area.

2. The semiconductor device of claim 1, wherein the plurality of lead-free solder bumps contain tin and silver, the plurality of contact pads are copper, and the exterior dielectric layer is an epoxy composite adhering to the plurality of contact pads around a periphery of the plurality of contact pads.

3. The semiconductor device of claim 1, wherein:
the respective copper post for each contact pad has an end cap distal from the contact pad, and has a portion between the contact pad and the end cap; and
a width of the end cap exceeds a width of the portion.

4. The semiconductor device of claim 3, wherein a height of the portion exceeds a height of the end cap.

5. The semiconductor device of claim 1, wherein the respective copper post for each contact pad extends through the respective opening beyond a thickness of the exterior dielectric layer and beyond a width of the respective opening for the contact pad.

6. The semiconductor device of claim 1, wherein the respective copper post for each contact pad extends through the respective opening beyond a thickness of the exterior dielectric layer.

7. The semiconductor device of claim 1, wherein:
the respective opening for each contact pad is a cylindrical opening having a height equal to a thickness of the exterior dielectric layer and a having diameter inside a periphery of the contact pad; and
the respective copper post for the contact pad extends from the contact pad through the respective opening and beyond the height and the diameter of the respective opening.

8. The semiconductor device of claim 1, wherein each of the plurality of lead-free solder bumps is reflow soldered to the respective copper post on the contact pad corresponding to the lead-free solder bump.

9. The semiconductor device of claim 1, further comprising a plurality of lead-free solder balls respectively reflow soldered to the plurality of respective copper posts in a grid arrangement, the respective copper post for each contact pad electrically coupled via the plurality of metal layers of the substrate to the lead-free solder bump to which the contact pad corresponds.

10. The semiconductor device of claim 1, further comprising a coating of a tin and copper on the plurality of respective copper posts, wherein each of the plurality of lead-free solder bumps and the coating on the respective copper post are together reflow soldered onto the respective copper post on the contact pad corresponding to the lead-free solder bump.

11. The semiconductor device of claim 1, wherein the plurality of respective copper posts have a roughened surface finish for enhancing a reflow soldering of each of the plurality of lead-free solder bumps onto the respective copper post on the contact pad corresponding to the lead-free solder bump.

12. The semiconductor device of claim 1, wherein the exterior dielectric layer is more flexible than others of the plurality of dielectric layers.

13. A method of fabricating a semiconductor device, comprising:
forming a semiconductor die having a plurality of lead-free solder bumps for connecting to a substrate;
forming an substrate including an exterior dielectric layer and a plurality of contact pads, the plurality of contact pads exposed through a plurality of respective openings in the exterior dielectric layer;
forming a plurality of respective copper posts on the plurality of contact pads, wherein the respective copper post for each contact pad extends from the contact pad through the respective opening for the contact pad;
aligning the plurality of lead-free solder bumps of the semiconductor die and the plurality of respective copper posts on the plurality of contact pads of the substrate; and
reflow soldering the plurality of lead-free solder bumps to the plurality of respective copper posts;
wherein:
the forming of the semiconductor die includes forming the semiconductor die having a plurality of respective silicon metal pads at the plurality of lead-free solder bumps; and
the reflow soldering includes reflow soldering each lead-free solder bump to a first area of the respective silicon metal pad and to a second area of the respective copper post, the first and second areas being equal in size and each size exceeding a cross-sectional area through the portion of the respective copper post between the contact pad and the end cap.

14. The method of claim 13, wherein the forming of the respective copper post for each contact pad includes forming the respective copper post having an end cap distal from the contact pad and having a portion between the contact pad and the end cap, the end cap having a width that exceeds a width of the portion of the copper post between the contact pad and the end cap.

15. The method of claim 14, wherein the forming of the respective copper post for each contact pad includes forming the portion of the respective copper post between the contact pad and the end cap to a thickness that exceeds a thickness of the end cap.

16. The method of claim 13, further comprising coating the plurality of respective copper posts with a tin and copper eutectic, wherein the reflow soldering includes reflow soldering each of the plurality of lead-free solder bumps and the coating on the respective copper post onto the respective copper post on the contact pad corresponding to the lead-free solder bump.

17. A method of fabricating a semiconductor device, comprising:
   forming a semiconductor die having a plurality of lead-free solder bumps for connecting to a substrate;
   wherein the forming of the semiconductor die includes forming the semiconductor die having a plurality of respective silicon metal pads at the plurality of lead-free solder bumps;
   forming an substrate including an exterior dielectric layer and a plurality of contact pads, the plurality of contact pads exposed through a plurality of respective openings in the exterior dielectric layer;
   wherein widths of each of the silicon metal pads on the semiconductor die are approximately equal to widths of the plurality of respective openings in the exterior dielectric layer of the substrate;
   covering the plurality of contact pads through the plurality of respective openings with a plurality of respective pre-solder pads;
   aligning the plurality of lead-free solder bumps of the semiconductor die and the plurality of respective pre-solder pads on the substrate; and
   reflow soldering both the plurality of lead-free solder bumps and the plurality of pre-solder pads onto the plurality of contact pads.

18. The method of claim 17, wherein the plurality of lead-free solder bumps include tin and silver, the plurality of contact pads are copper, and the plurality of pre-solder pads include tin and copper.

\* \* \* \* \*